(12) United States Patent
Ebsen et al.

(10) Patent No.: US 10,997,068 B1
(45) Date of Patent: May 4, 2021

(54) RAPID SSD PRECONDITIONING

(71) Applicant: Seagate Technology LLC, Fremont, CA (US)

(72) Inventors: David Scott Ebsen, Minnetonka, MN (US); Dana Lynn Simonson, Owatonna, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/789,026

(22) Filed: Feb. 12, 2020

(51) Int. Cl.
*G06F 12/02* (2006.01)
*G11C 16/04* (2006.01)

(52) U.S. Cl.
CPC ...... *G06F 12/0246* (2013.01); *G11C 16/0483* (2013.01); *G06F 2212/7201* (2013.01); *G06F 2212/7209* (2013.01)

(58) Field of Classification Search
CPC ......... G06F 12/0246; G06F 2212/7201; G06F 2212/7209; G11C 16/0483
See application file for complete search history.

(56) References Cited

U.S. PATENT DOCUMENTS

| | | | |
|---|---|---|---|
| 8,239,618 B2 | 8/2012 | Kotzur et al. | |
| 2012/0260025 A1* | 10/2012 | Hida | G06F 12/0246 711/103 |
| 2018/0059983 A1* | 3/2018 | Rogers | G06F 3/0653 |

* cited by examiner

*Primary Examiner* — Jay W. Radke
(74) *Attorney, Agent, or Firm* — Taylor English Duma LLP

(57) ABSTRACT

Methods, apparatuses, and computer-readable media for providing extremely rapid preconditioning of an SSD. Upon receiving a precondition command from a host operably connected to the SSD to precondition a range of LBAs of the storage media, a plurality of physical units of the storage media to be preconditioned are determined based on the range of LBAs. A workload pattern is determined from the precondition command, and upon determining that the workload pattern indicates a random pattern, a valid page count for each of the plurality of physical units is computed based on a random distribution. Forward mapping table entries of a forward mapping table associated with the storage media corresponding to the range of LBAs is then populated with random physical addresses from the plurality of physical units based at least on the computed valid page count for each of the plurality of physical units.

20 Claims, 5 Drawing Sheets

RAPID SSD PRECONDITIONING

BRIEF SUMMARY

The present disclosure relates to technologies for providing extremely rapid preconditioning of an SSD or other storage device having a solid-state media. According to some embodiments, a method for rapidly preconditioning a storage device comprising a solid-state storage media comprises, upon receiving a precondition command from a host operably connected to the storage device to precondition a range of LBAs of the storage media, determining a plurality of physical units of the storage media to be preconditioned based on the range of LBAs. A workload pattern is determined from the precondition command, and upon determining that the workload pattern indicates a random pattern, a valid page count for each of the plurality of physical units is computed based on a random distribution. Forward mapping table entries of a forward mapping table associated with the storage media corresponding to the range of LBAs is then populated with random physical addresses from the plurality of physical units based at least on the computed valid page count for each of the plurality of physical units.

According to further embodiments, a storage device comprises a storage media and a controller coupled to the storage media. The controller is operable to, upon receiving a precondition command from a host operably connected to the storage device to precondition a range of logical block addresses (LBAs) of the storage media, determine a plurality of physical units of the storage media to be preconditioned based on the range of LBAs. The controller fills the plurality of physical units with data consistent with a data pattern specified with the precondition command and determines a workload pattern from the precondition command. The controller then populates forward mapping table entries of a forward mapping table associated with the storage media corresponding to the range of LBAs with physical addresses from the plurality of physical units based at least on the determined workload pattern.

According to further embodiments, a computer-readable medium has processor-executable instructions stored thereon that, when executed by a CPU of a controller of a storage device comprising a solid-state storage media, cause the controller to determine a plurality of physical units of the storage media to be preconditioned based on a range of logical block addresses (LBAs) specified with a precondition command received from a host operably connected to the storage device. The controller determines a workload pattern from the precondition command, and, upon determining that the workload pattern indicates a random pattern, computes a valid page count for each of the plurality of physical units based on a random distribution. The controller then populates forward mapping table entries of a forward mapping table associated with the storage media corresponding to the range of LBAs with random physical addresses from the plurality of physical units based at least on the computed valid page count for each of the plurality of physical units.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

Figure 1:
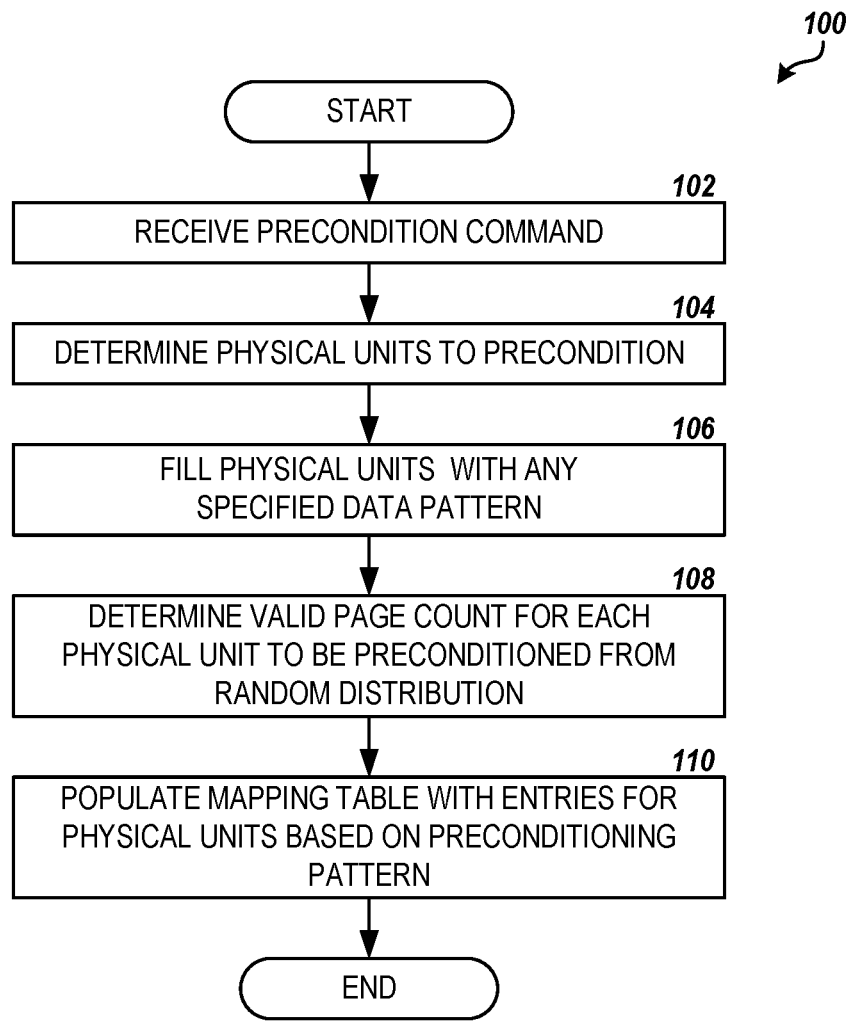
FIG. 1 is a flow diagram showing one routine for rapidly preconditioning an SSD, according to embodiments described herein.

The following detailed description is directed to technologies for providing extremely rapid SSD preconditioning. Rapid evolution in cell density and multi-level cell technology of NAND flash and other solid-state storage media has caused solid-state drive ("SSD") capacities to grow exponentially. Third-party OEMs, data center operators, enterprise customers, and other commercial purchasers of these high-capacity drives may require performance testing and qualification of each model before implementing the drives into their infrastructure. Performance of an SSD can depend on a number of factors, such as the write history of the device, percentage of free, unused blocks on the media, the amount of overprovisioning of the device, the state of garbage collection, and the like. In order to obtain reliable performance measurements from such testing, a new SSD needs to be preconditioned in order to place the drive in a realistic, steady-state condition to account for these factors. Traditionally this may involve writing and rewriting data to the full stated capacity of the SSD over multiple passes, which for these high-capacity drives can take many hours or days.

According to the embodiments described herein, the time required to precondition an SSD for performance testing may be dramatically reduced by having the controller generate mapping table(s) and other metadata for the storage media that simulates the desired state based on known, mathematically predictable patterns exhibited by the storage media throughout its lifecycle. In some embodiments, a host computer attached to the drive for execution of performance testing can first issue a precondition command to the controller, specifying parameters to direct the preconditioning process, such as a range of logical block addresses for preconditioning, a workload pattern to simulate (e.g., sequential or random, write request size, etc.), whether to initialize the mapping table before starting preconditioning, a data pattern to write to the blocks of the storage media, and/or the like. The controller may then generate the simulated mapping table(s) and other metadata on the drive based on the specified parameters and its internal knowledge of the drive's physical capacity, over-provisioning, defective media, and the like. The resulting preconditioning may occur in seconds or minutes instead of hours or days.

A complete preconditioning of an SSD may be accomplished by the host issuing one or more of these preconditioning commands to the controller with varying parameters.

In the simplest case a single preconditioning command could be issued to precondition the entire SSD according to the same parameters. In a more complex case, different portions of the logical space can be preconditioned randomly or sequentially through a series of commands. In practice, sequential preconditioning commands could be sent before random preconditioning commands.

Once the preconditioning is completed by the controller, the SSD may exhibit the state of fully utilized capacity with the mapping table(s) having 100% valid entries pointing to particular physical locations on the media. Depending on the workload pattern specified for preconditioning, there will be a predictable pattern to the physical addresses in the mapping table(s). For example, with 100% sequential preconditioning of the complete logical capacity or the drive, the physical addresses stored in the mapping table will be generally be monotonically incrementing. With 100% random preconditioning of the drive, the entries in the mapping table will refer to scattered physical locations, and the managed physical units of storage will have varying amounts of valid and invalid data pages, based on a mathematical distribution accounting for the age of the various physical units and the amount of overprovisioning of the drive. In this state, the host may now execute performance testing of the SSD and return reliable results.

FIG. 1 illustrates one routine 100 for providing extremely rapid SSD preconditioning, according to the embodiments described herein. According to some embodiments, the routine 100 may be performed by a controller of an SSD or other storage device having solid-state memory. In other embodiments, the routine 100 may be performed by a driver or module on a host computer connected to the storage device, a controller of a storage array to which the storage device belongs, or the like. The routine 100 includes step 102, where a precondition command is received from the host computer connected to the SSD. The received precondition command may include a set of parameters for the precondition operation, including a range of logical block addresses ("LBAs") indicating the portion of the logical storage capacity associated with the storage media of the SSD for preconditioning, a workload pattern to simulate (e.g., sequential or random, write request size, etc.), whether to initialize the mapping table before starting preconditioning, a data pattern to write to the blocks of the storage media, and/or the like.

From step 102, the routine 100 proceeds to step 104, where the physical units (blocks, garbage collection units, etc.) of the storage media to be preconditioned are determined based on the specified LBA range. For example, for a specified workload pattern of "random", the physical units to be preconditioned may depend on the storage capacity of a physical unit, the amount of storage capacity represented by the LBA range, an amount of overprovisioning for the drive, a number of defective and/or reserved blocks on the storage media, and/or the like.

The routine 100 then proceeds from step 104 to step 106, where any specified data pattern in the precondition command parameters is written to the physical units to be preconditioned. For example, the specified data pattern and all associated metadata (validity flags, ECC codes, etc.) may be written directly to the physical units of the storage media, bypassing the normal writing/programming processes of the controller. To fill the physical unit, the specified data pattern may be repeated the requisite number of times based on the size of the physical units. For example, a 4 KB data pattern simulating a random write may be written 8192 times to a physical unit comprising 8 blocks of 256 4K pages. Writing data to the physical units during preconditioning may allow the drive to respond normally to write commands in any subsequent performance commands, e.g., relocating valid pages in a block before writing new pages, instead of simulating a response, providing for more accurate write performance test results.

From step 106, the routine 100 proceeds to step 108, where a valid page count for each physical unit to be preconditioned is determined to simulate the specified workload pattern. For a random workload pattern, the number of valid pages in a physical unit after multiple random writes and rewrites will vary randomly across the physical units depending on an amount of overprovisioning of the storage device, the age of each physical unit, and the like. According to embodiments, the random distribution of valid page count across the physical units of a substantially full drive follows a predictable mathematical model based, at least in part, on the amount of overprovisioning of the device, as is described in more detail below.

The routine 100 proceeds from step 108 to 110, where the entries of the forward mapping table for the SSD corresponding to the specified LBA are populated with physical addresses from the physical units to be preconditioned to simulate the specified workload pattern. For example, for a random workload, the physical addresses may be selected randomly from the physical units to be preconditioned based on the valid page count determined for each physical unit in step 108 above, thus simulating random writes of data to these physical units over time. From step 110, the routine 100 ends.

Figure 2:
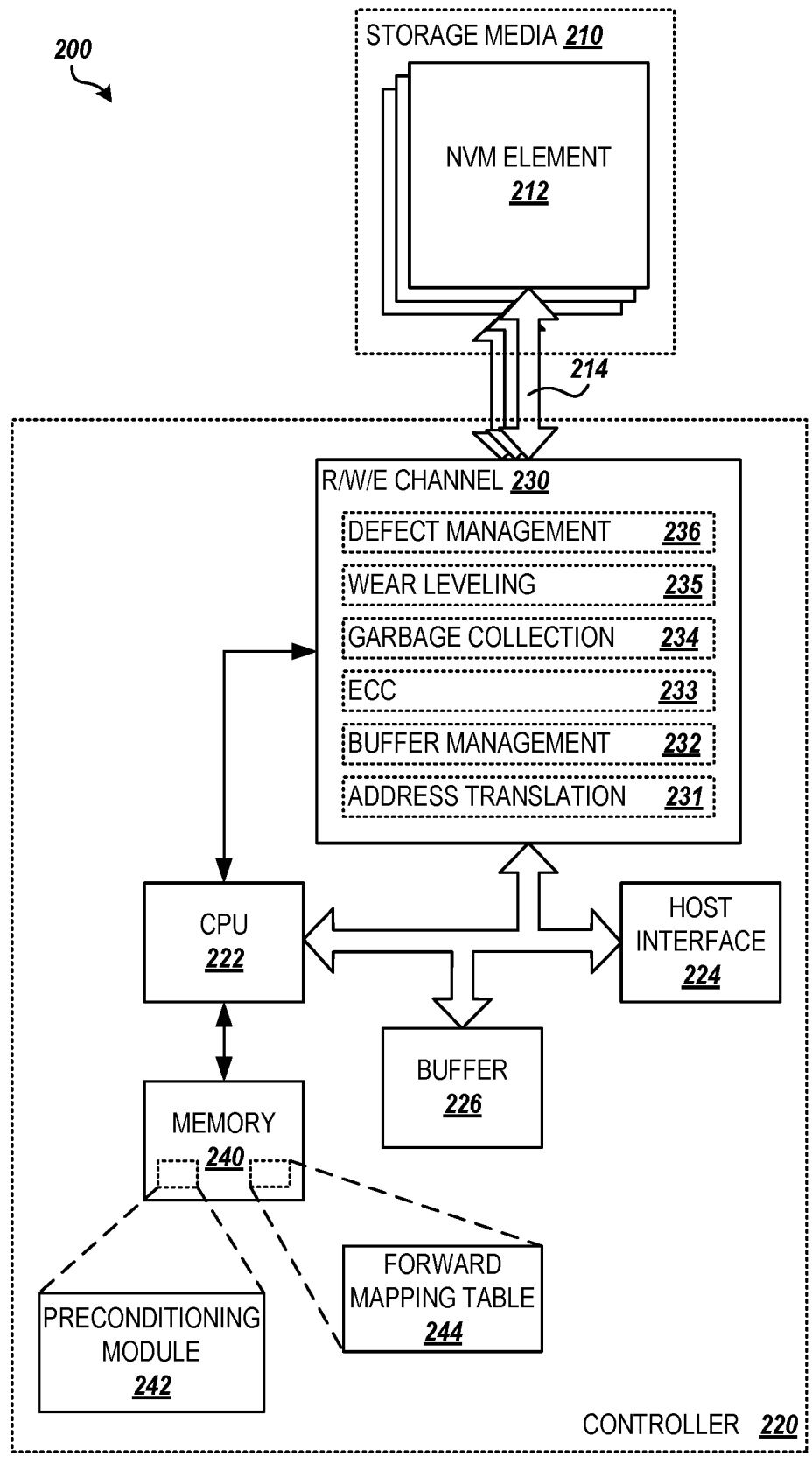
FIG. 2 is a block diagram showing components of an illustrative storage device in which the embodiments described herein may be implemented.

FIG. 2 and the following description are intended to provide a general description of a suitable environment in which the embodiments described herein may be implemented. In particular, FIG. 2 shows an illustrative storage device 200, such as an SSD device, along with hardware, software and components for providing extremely rapid preconditioning in the storage device, according to the embodiments provided herein. The storage device 200 includes a storage media 210. In some embodiments, the storage media 210 may comprise one or more non-volatile memory ("NVM") elements 212. The NVM elements 212 may comprise NAND flash memory dies. In other embodiments, the storage media 210 may comprise NOR flash memory, vertical NAND ("V-NAND") or 3D NAND flash memory, flash memory using polysilicon or silicon nitride technology-based charge storage cells, phase-change memory ("PCM"), racetrack memory, or any other type of solid-state storage media. An NVM element 212 may also be referred to herein as a "die."

The storage device 200 may further comprise a controller 220 that controls the operations of the storage device. According to various embodiments, the controller interfaces with the NVM elements 212 through one or more device interfaces 214. In some embodiments, the device interface(s) 214 comprises of an Open NAND Flash Interface ("ONFI") compatible interface. In further embodiments, the device interface(s) 214 may comprise of one or more of an asynchronous interface; a synchronous interface; a single-data-rate ("SDR") interface; a double-data-rate ("DDR") interface; a toggle-mode compatible flash interface; a non-standard version of any of the preceding interfaces; a custom interface; or any other type of interface used to define the communication with the NVM elements 212.

The device interface(s) 214 may be organized into some number L of channels, with each NVM element 212 connected through one of the channels. Each channel may support some number P of NVM elements 212. For example, the device interface(s) 214 may comprise 16 channels, connected to 64 NVM elements 212 organized into four banks. According to embodiments, the controller 220 may be enabled to access NVM elements 212 connected to separate channels concurrently. In further embodiments, the device interface(s) 214 may be organized in one or more groups of channels with one or more of NVM elements 212 per channel, or any other organization of one or more of the NVM elements 212 onto the device interface(s) 214.

Figure 3:
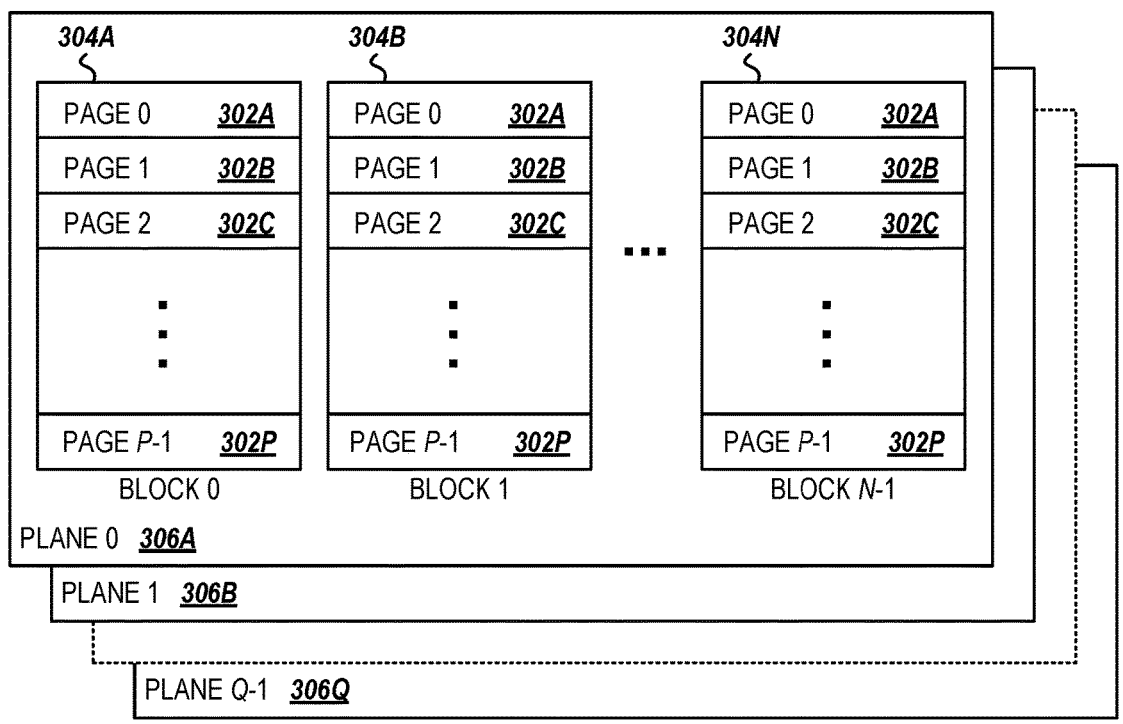
FIG. 3 is a block diagram showing an exemplary storage layout of a NAND flash die, according to embodiments described herein.

FIG. 3 shows one exemplary storage layout of an individual NVM element 212 comprising a multi-layered NAND flash die. The NAND flash die contains numerous storage cells organized into multiple arrays. Each storage cell may store a single bit of data (e.g., single-level cell ("SLC")) or two or more bits (e.g., multiple-level cell ("MLC"), triple-level cell ("TLC"), quad-level cell ("QLC"), etc.). Each array of storage cells constitutes a block, such as block 0 through block N-1 304A-304N (referred to generally as block 304), with the rows of each array constituting pages within the block, such as page 0 through page P-1 302A-302P (referred to generally as page 302). In further embodiments, the blocks 304 may be spread across multiple layers of the NVM element 212, referred to as planes, such as planes 306A-306Q (referred to generally as plane 306).

The storage capacity of a particular NVM element 212 depends on the type of the storage cells (i.e., the number of bits stored per cell), the number of cells per row (page 302), the number of pages per block 304, the number of blocks 304 per plane 306, and the number of planes (layers) in the NVM element. Common page sizes include 4 KB, 8 KB, or 16 KB, with numerous (e.g., 128, 256, 512, 1152, 1344, 1792) pages 302 per block 304. Block sizes, therefore, vary with device type (e.g., 128 KB, 8 MB, 18 MB, 21 MB, 28 MB) and are likely to continue to increase. The storage cells of the NVM elements 212 generally must be erased before data can be programmed (written) or re-programmed. In NAND-based NVM elements 212, erasure may only be possible an entire block 304 at a time. Therefore, in typical operation, while data may be programmed and read by individual page 302 or sub-page level (also referred to herein as the "read unit"), erasure is performed at the block 304 level (also referred to herein as the "erasure unit").

Returning to FIG. 2, the controller 220 may include a central processing unit ("CPU") 222 to monitor and control the operations of the storage device 200. The CPU 222 may represent one or more single-core or multi-core processors known in the art. The controller 220 may further include a host interface 224 allowing the storage device 200 to communicate with one or more host devices or other components (not shown), such as a server computer, personal computer ("PC"), laptop, tablet, game console, set-top box, a storage-area controller, or any other electronics device that can be communicatively coupled to the storage device 200 to store and retrieve data from the storage device. In some embodiments, the controller may be connected to the host device(s) through the host interface 224 via a switch/fabric/intermediate controller (not shown) or some other intermediate device. According to some embodiments, the host interface may be compatible with a Serial ATA ("SATA") interface standard. In further embodiments, the host interface 224 may be compatible with one or more of an IDE interface standard, a SCSI interface standard, a SAS interface standard, a PCIe interface standard, a USB interface standard, a CF interface standard, an MMC interface standard, an SD interface standard, and the like.

The controller 220 may process read and write commands from the host device(s) by formatting the associated data and transferring the formatted data via a read/write/erase channel 230 from and to physical locations on the storage media 210 through the device interface(s) 214. The read/write/erase channel 230 includes the necessary modules or circuits to erase, encode, write, read, and decode data from the storage media 210. The read/write/erase channel 230 may also be referred to as the flash translation layer ("FTL").

According to embodiments, the read/write/erase channel 230 includes an address translation module 231 that provides translations between data addressing utilized by the host device(s), e.g., logical bock addresses ("LBAs"), and physical location addressing used by the device interface(s) 214 for the storage media 210, e.g. channel, die, block 304, and pages 302 in the NVM elements 212. In some embodiments, the address translation module 231 utilizes one or more logical to physical mapping tables to perform address translation, as described in more detail below in regard to FIG. 4.

The read/write/erase channel 230 may further include a buffer management module 232 that manages a buffer 226 for the temporary storage of user data and metadata associated with the NVM elements 212 during various access (read and write) operations, according to some embodiments. For example, the buffer 226 may temporarily store write data pending verify operations upon data being programmed to the NVM elements 212. In some embodiments, the buffer 226 may comprise a local memory, such as static random access memory ("SRAM") or dynamic random access memory ("DRAM") onboard the controller 220. In further embodiments, the buffer may include one or more external SRAM or DRAM memories and/or a buffer area in one or more of the NVM elements 212.

In further embodiments, the read/write/erase channel 230 includes an error-correcting code ("ECC") module 233 that provides error correction and/or redundancy functions in the reading or writing of data to and from the NVM elements 212. For example, the ECC module 233 may calculate and write ECC bits along with data programmed to the NVM elements 212. When the data is read back from the NVM elements 212, the ECC module 233 may utilize the ECC bits to correct any read errors. In some embodiments, the ECC algorithms utilized by the ECC module 233 may change from weaker codes gradually moving towards stronger codes as the NVM elements 212 age.

The read/write/erase channel 230 also include a garbage collection module 234. The garbage collection module 234 performs garbage collection by erasing "stale" or no longer used blocks 304 of the NVM elements 212 to make them eligible to be re-written with new data. The garbage collection module 234 may be further enabled to move stored data within or between the NVM elements 212 to make larger contiguous portions of the flash memory available for writing.

According to embodiments, the garbage collection process is managed for some number K of physical units, referred to herein as garbage collection units ("GCUs"), comprising one or more erase units (blocks 304) on the storage media 210. In some embodiments, the blocks 304 included in a GCU may allow for parallel execution of a command across the blocks. For example, a GCU may comprise a corresponding block 304 from each plane 306 of an NVM element 212 (die), a corresponding block from each die on a channel, or some other combination of blocks. The blocks 304 of a GCU maintain the same operational state, e.g., available for new storage, allocated and actively storing data, or subject to garbage collection process. A typical garbage collection operation may involve identifying currently valid data within a GCU, moving the valid data to a different GCU, and erasing each of the blocks 304 of the GCU. Once the garbage collection operation is complete, the GCU may be returned to a pool of available GCUs for storage. The controller 220 may maintain metadata associated with each GCU for the management of the physical units and the read/write, garbage collection, and other processes of the storage deice 200. The metadata may be stored within storage area of the GCU, or the metadata may be stored elsewhere in the storage media 210, such as in specifically configured metadata locations. For example, the metadata may include a staleness count, indicating a number of read units (pages 302) in the physical unit containing stale or invalid data, an erasure/recycle count for the physical unit, write history information for the physical unit, and the like.

The read/write/erase channel 230 may also include a wear-leveling module 235, according to further embodiments The wear-leveling module 235 works to ensure program/erase cycles are distributed evenly across all blocks 304 in the NVM elements 212 in order to avoid some prematurely wearing out before other blocks, potentially impacting performance and shortening the lifespan of the storage device 200. For example, wear-leveling module 235 may track a recycle count of each block 304 in the NVM elements 212 in order to allow level use of free blocks for new writes. According to some embodiments, the wear-leveling process may be managed for the same physical units (GCU) as the garbage collection process.

In further embodiments, the read/write/erase channel 230 includes a defect management module 236. The defect management module 236 may detect and deal with bad blocks 304 in the NVM elements 212 when the blocks become unusable or unreliable for the storage of data. This may include marking the block 304 as defective and substituting a block from a spare area in the NVM elements 212 for storage of the data in a defective block. It will be appreciated that the defect management module 236, the wear-leveling module 235, the garbage collection module 234, the ECC module 233, the buffer management module 232, and the address translation module 231 may comprise hardware circuits in the read/write/erase channel 230, processor-executable instructions for execution in the CPU 222, or any combination of these and other components in the controller 220.

The controller 220 may further include a computer-readable storage medium or "memory" 240 for storing processor-executable instructions, data structures, and other information. The memory 240 may comprise a non-volatile memory, such as read-only memory ("ROM") and/or flash memory, and a random-access memory ("RAM"), such as SRAM or DRAM. The memory 240 may further comprise a portion of the non-volatile storage media 210 of the storage device 200. According to some embodiments, the memory 240 may store a firmware that comprises modules, commands, and data necessary for performing the operations of the storage device 200. For example, the memory 240 may store a preconditioning module 242 containing logic and data described herein for providing extremely rapid preconditioning of an SSD. In further embodiments, the memory 240 may store processor-executable instructions that, when executed by the CPU 222, perform the routines 100 and 600 for providing extremely rapid preconditioning of an SSD, as described herein.

The memory 240 may further store supporting data utilized by the read/write/erase channel 230. For example, the memory 240 may store mapping tables and metadata utilized by the address translation module 231 and the garbage collection module 234, erase/recycle count tables utilized by the wear-leveling module 235, and defective blocks lists utilized by the defect management module 236, among other information.

Figure 4:
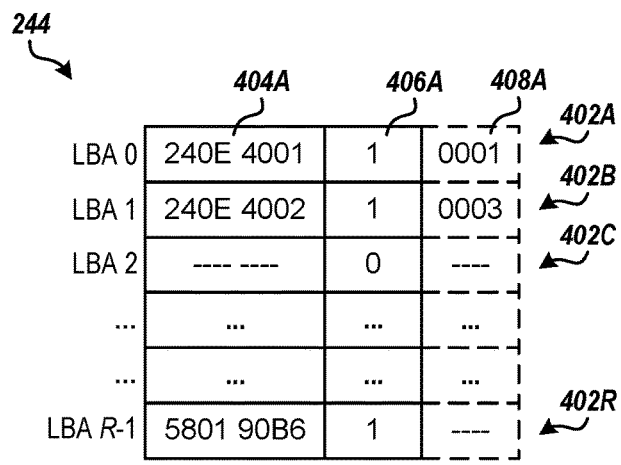
FIG. 4 is a data structure diagram showing details of a forward mapping table in an SSD, according to embodiments described herein.

According to embodiments, the memory 240 contains a forward mapping table 244 utilized by the address translation module 231 to lookup physical addresses mapped to LBAs specified in read and write commands. For example, FIG. 4 shows an example structure of a flat forward mapping table 244 utilized to provide logical to physical address translation by the address translation module 231. The forward mapping table 244 comprises an ordered list of some number R of forward mapping table entries, such as forward mapping table entries 402A-402R (referred to herein generally as forward mapping table entries 402), indexed by LBA or some derivative of LBA. Each forward mapping table entry 402 contains a physical address, such as physical address 404A (referred to herein generally as physical address 404), of a physical unit of storage space in the storage media 210, referred to herein as a "mapping unit." For example, a mapping unit may comprise a page 302 in an NVM element 212, a portion of a page, a combination of two or more pages, or the like. The physical address may comprise a combination of fields that identify the components of the physical address of the mapping unit, e.g. GCU number, channel number, die number, block number, and page number.

Figure 5A:
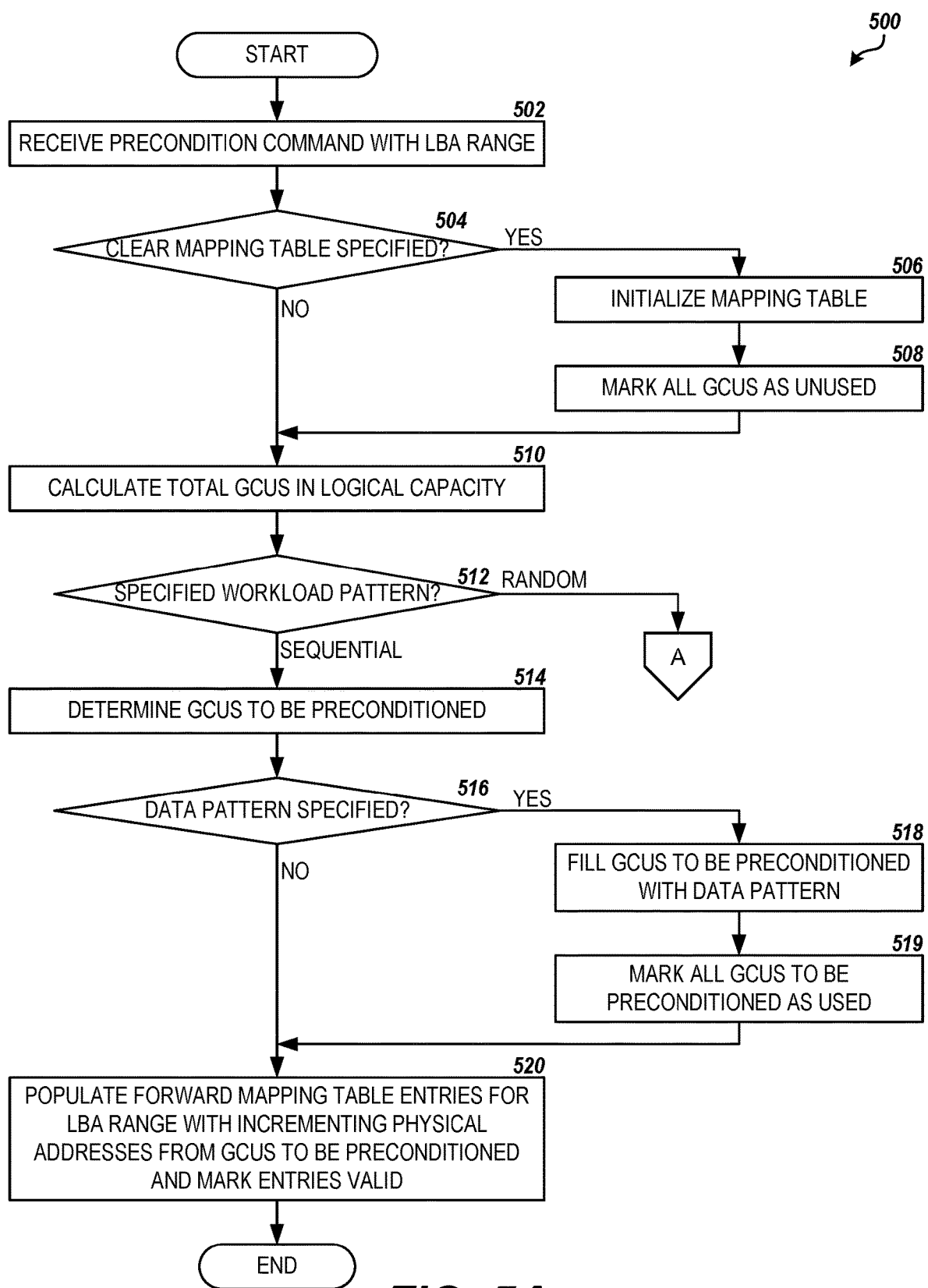
FIGS. 5A-5B are flow diagrams showing another routine for rapidly preconditioning an SSD, according to embodiments described herein.
Figure 5B:
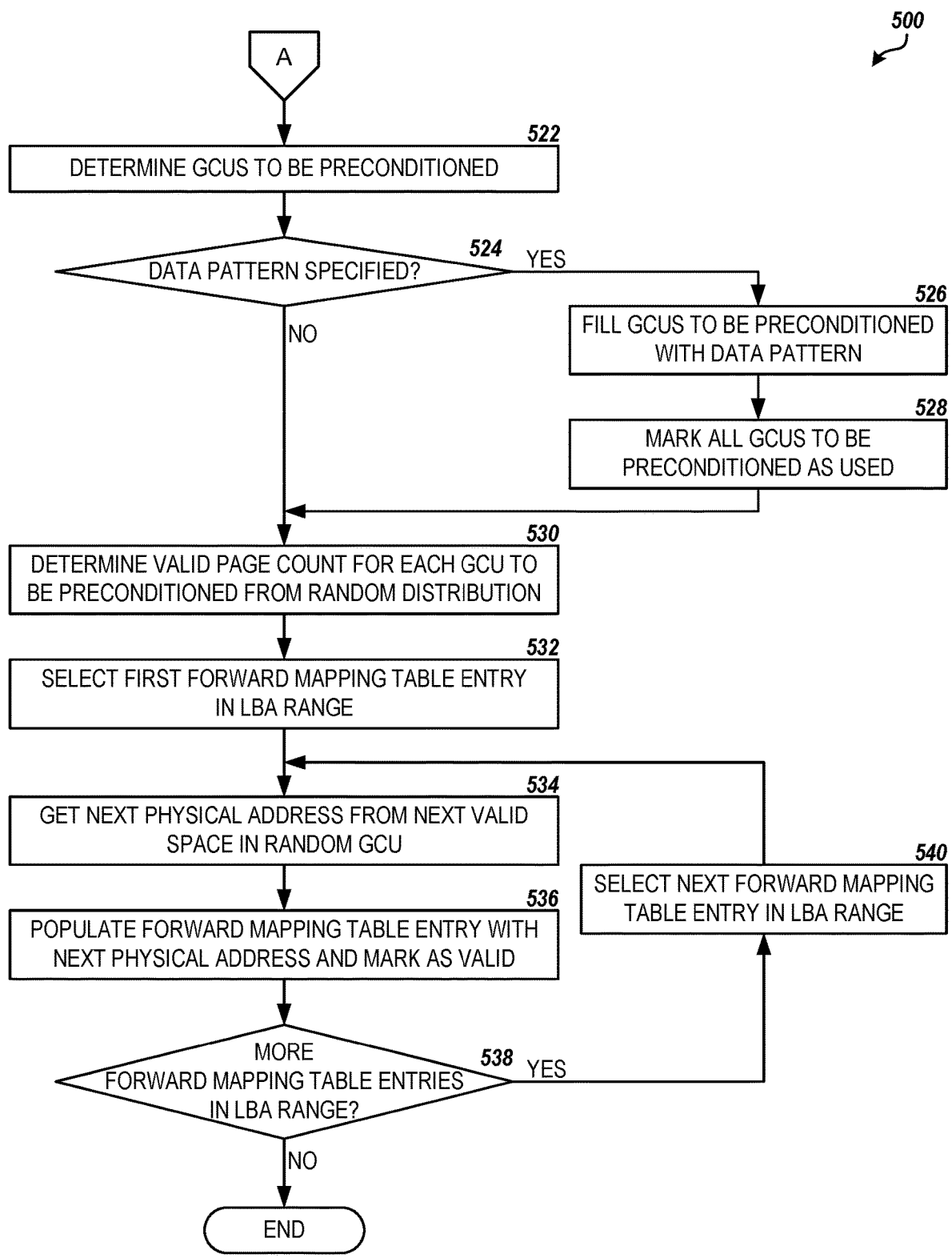

According to some embodiments, each forward mapping table entry 402 further contains a validity Boolean field, such as validity Boolean 406A (referred to herein generally as validity Boolean 406), indicating whether the LBA has been mapped to a valid mapping unit in the storage media 210. In further embodiments, each forward mapping table entry 402 may also contain a pattern indicator field, such as pattern indicator 408A (referred to herein generally as pattern indicator 408), populated during preconditioning and used to indicate one of one or more established patterns of data that should be returned for a read of data from the target mapping unit, as will be described further below in regard to FIGS. 5A and 5B.

The number R of forward mapping table entries 402 may depend on the size of a mapping unit, e.g. a page 302, in the storage media 210 and the total logical capacity of the storage device 200. For example, in a 32 TB SSD with map unit size of 4 KB, the forward mapping table 244 may comprise approximately 8.590 billion entries. In some embodiments, the forward mapping table 244 may be stored in DRAM on the controller 220 for high-speed address lookup to improve read latency in the storage device 200. In further embodiments, the forward mapping table 244 may be stored on the storage media 210 with portions of the table cached into the DRAM as needed by the controller 220. In yet further embodiments, the forward mapping table 244 may be structured in multiple, tiered sections, with different sections swapped between the storage media 210 and the DRAM to support the current read/write operations of the controller 220.

In addition to the memory 240, the environment may include other computer-readable media storing program modules, data structures, and other data described herein for providing extremely rapid preconditioning of an SSD or other storage device using solid-state media. It will be appreciated by those skilled in the art that computer-readable media can be any available media that may be accessed by the controller 220 or other computing system for the non-transitory storage of information. Computer-readable media includes volatile and non-volatile, removable and non-removable recording media implemented in any method or technology, including, but not limited to, RAM, ROM, flash memory or other solid-state memory technology, compact disc ROM ("CD-ROM"), digital versatile disk ("DVD"), or other optical storage, magnetic cassettes, magnetic tape, magnetic disk storage or other magnetic storage devices and the like.

It will be appreciated that the structure of the storage device 200 may be different than that illustrated in FIG. 2 and described herein. For example, the CPU 222, read/write/erase channel 230, memory 240, and other components and circuitry of the storage device 200 may be integrated within a common integrated circuit package, such as a system-on-chip ("SoC"), or they may be distributed among multiple integrated circuit packages. Similarly, the illustrated connection pathways are provided for purposes of illustration and not of limitation, and some components and/or interconnections may be omitted for purposes of clarity. It will be further appreciated that the storage device 200 may not include all of the components shown in FIG. 2, may include other components that are not explicitly shown in FIG. 2, or may utilize an architecture completely different than that shown in FIG. 2.

FIG. 5 illustrates one routine 500 for providing extremely rapid SSD preconditioning, according to the embodiments described herein. According to some embodiments, the routine 500 may be performed by the preconditioning module 242 in the controller 220 of an SSD or other storage device 200 utilizing solid-state media. In other embodiments, the routine 500 may be performed by a host connected to an SSD, or a switch/fabric/intermediate controller connecting one or more SSDs to a host. The routine 500 includes step 502, where a precondition command is received by the preconditioning module 242, specifying a range of LBAs. In some embodiments, the preconditioning module 242 may accept a number of parameters with the precondition commands, including, but not limited to:

LBA Range—a range of LBAs corresponding to a portion of the storage media 210 to be preconditioned Data Request Size—a size of data request (e.g., in KiB) to simulate in the preconditioning Workload Pattern—write pattern to be simulated (e.g., random or sequential)

Data Pattern—an optional data pattern to write to the storage media 210 during preconditioning. This size of the data pattern equals the data request size, according to some embodiments.

Clear Forward Mapping Table—whether the forward mapping table should be initialized (cleared) before the preconditioning process begins For example, a precondition command may be received from a host specifying an LBA range corresponding to the entire range of LBAs stored in the logical storage capacity of the storage media 210 in order to precondition the entire drive with one set of parameter values. In another example, the LBA range may correspond to a portion of the logical storage capacity of the SSD to be preconditioned with a specific set of parameters as part of a series of precondition commands sent by the host.

Next, the routine 500 proceeds from step 502 to step 504, where the preconditioning module 242 determines whether the forward mapping table 244 is to be cleared based on the clear forward mapping table parameter specified with the precondition command. If the clear forward mapping table parameter is set to True, the routine 500 proceeds from step 504 to step 506, where the preconditioning module 242 initializes the forward mapping table 244. For example, the preconditioning module 242 may set the validity Boolean field 406 for all of the forward mapping table entries 402 to False (0) in order to initialize the table. In another example, the preconditioning module 242 may set the physical address for each entry to null values (e.g., 0000 0000). Next, at step 508, the preconditioning module 242 marks all of the GCUs on the storage media 210 as unused, i.e., deleted by the host and/or reclaimed by the garbage collection routine and available for new storage.

From step 508, or if the clear forward mapping table parameter is set to False, the routine 500 proceeds to step 510, where the preconditioning module 242 calculates the total count of physical units, i.e. GCUs, in the logical capacity of the storage media 210. According to embodiments, this may be accomplished by dividing the logical storage capacity of the storage media 210 by the amount of storage in a GCU defined for the storage device 200.

Next, at step 512, the routine 500 may take two different branches depending on the type of workload pattern specified in the parameters of the precondition command. If the workload pattern parameter specifies that a sequential writing pattern is to be simulated, then the routine 500 proceeds to step 514, where the preconditioning module 242 determines the GCUs to be preconditioned based on the LBA range specified in the parameters of the precondition command. According to embodiments, this may include determining a number of GCUs to be preconditioned by multiplying the ratio of logical capacity represented in the LBA range to total logical capacity by the total count of GCUs in the logical capacity determined at step 510. That number of GCUs may then be allocated for the preconditioning operation from the available GCUs on the storage media.

The routine 500 proceeds from step 514 to step 516, where the preconditioning module 242 determines if a data pattern to be written to the storage media 210 was specified in the parameters to the precondition command. If a data pattern was specified in the precondition command parameters, then the routine 500 proceeds to step 518, where the preconditioning module 242 writes the data pattern to the pages of the GCUs identified for preconditioning in step 514 according to the size of the data pattern to be written and the page size of the GCUs. For example, a 4 KiB data pattern may be written twice to each 8K page 302 on an NVM element 212, and may be repeated 512 times in each block 304. According to some embodiments, since the same fix-sized data pattern is to be written to all pages 302 of the allocated GCUs, valid ECC codes and other page-level metadata may be calculated for the data pattern once, with the resulting data pattern and metadata written directly to the storage media 210, bypassing the ECC module 233 and/or other modules of the read/write/erase channel 230 and improving writing performance. In further embodiments, writing of certain page and/or block-level metadata in the GCUs to be preconditioned may be skipped since valid metadata may not be necessary for the performance testing that will follow preconditioning. Next, at step 519, the preconditioning module 242 marks all of the GCUs to which the data pattern was written as used, i.e. allocated and actively storing data.

From step 519, or if the data pattern parameter was not specified, the routine 500 proceeds to step 520, where the preconditioning module 242 populates the forward mapping table entries 402 in the forward mapping table 244 corresponding to the LBA range with monotonically incrementing physical addresses of mapping units within the GCUs allocated to the preconditioning operation, simulating a host sequential write of the data pattern to the drive over the specified LBA range. The preconditioning module 242 further marks the populated forward mapping table entries 402 as valid, by setting the validity Boolean 406 of each to True (1), for example. From step 520, the routine 500 ends.

If, at step 512, the workload pattern parameter specifies that a random writing pattern is to be simulated, then the routine 500 proceeds to step 522, where the preconditioning module 242 determines the GCUs to be preconditioned based on the LBA range specified in the parameters of the precondition command and an overprovisioning percentage for the storage device 200. As is known in the art, the storage media 210 of various SSDs may include an amount of over-provisioning ("OP"), or an extra amount of physical space beyond the indicated logical storage capacity of the SSD. In a functioning SSD, the entire physical space will store valid data, invalid data, or no data at all. The amount of overprovisioning for an SSD is specified as the ratio of the sum of the invalid data storage and the no data storage to the logical capacity, or:

$$OP = \frac{\text{physical capacity} - \text{logical capacity}}{\text{logical capacity}}$$

According to embodiments, the actual OP of a storage device may further take into account the portion of physical storage space required for out-of-band metadata, reserved blocks, defective blocks, and the like.

According to embodiments, determining the GCUs to be preconditioned for a simulation of a random writing pattern includes determining a number of GCUs for the logical space to be preconditioned, similar to that determined above in step 514, as well as determining a number of GCUs for overprovisioning by multiplying the OP ratio by the number of GCUs for the logical space. The total of the number of GCUs for the logical space plus the number of GCUs for the overprovisioning may then be allocated for the preconditioning operation from the available GCUs on the storage media 210.

The routine 500 proceeds from step 522 to step 524, where the preconditioning module 242 determines if a data pattern to be written to the storage media 210 was specified in the parameters to the precondition command. If a data pattern was specified in the precondition command parameters, then the routine 500 proceeds to steps 526 and 528, where the preconditioning module 242 writes the data pattern to the pages of the GCUs identified for preconditioning in step 522, in a similar fashion to that described in steps 518 and 519 above. According to some embodiments, From step 528, or if the data pattern parameter was not specified, the routine 500 proceeds to step 530, where the preconditioning module 242 determines a valid page count for each GCU to be preconditioned. It will be appreciated that, as a host randomly writes and rewrites logical blocks of data to an SSD, each block or physical unit (GCU) will manifest a random number of valid data pages depending on the order in which the GCUs were filled. In addition, the amount of time since the GCU was last subjected to garbage collection will also affect the number of valid data pages, with older (less recently recycled) GCUs having less valid data pages and newer (more recently recycled) GCUs having more valid data pages. For an SSD that has been subjected to a pattern of random write cycles by a host over a longer period of time and has become substantially full, this pattern of number of valid data pages per GCU becomes mathematically predictable, and tends to follows a uniform random distribution determinable by a leaky bucket algorithm dependent on the amount of overprovisioning (OP) for the drive, the programing and garbage collection methodologies utilized, and the like.

According to some embodiments, for each GCU to be preconditioned, the preconditioning module 242 computes a count of valid pages using a random leaky bucket algorithm based on the amount of overprovisioning (OP) of the drive. The count of valid pages computed for each GCU to be preconditioned is stored in temporary memory, and the routine 500 proceeds to step 532, where the preconditioning module 242 begins a loop through the forward mapping table 244 for the LBA range specified in the parameters of the precondition command by selecting the forward mapping table entry 402 corresponding to the first LBA in range. The routine 500 then proceeds from step 532 to step 534, where the preconditioning module 242 determines a physical address 404 for the forward mapping table entry 402 by selecting a random GCU from the GCUs to be preconditioned, and then selecting the next valid mapping unit in the GCU based on the number of valid pages for the GCU calculated in step 530. From step 534, the routine 500 proceeds to step 536, where the preconditioning module 242 populates the selected forward mapping table entry 402 with the physical address 404 determined in step 534 and marks the forward mapping table entry as valid, e.g. by setting the validity Boolean 406 of the entry to True (1).

At step 538, the preconditioning module 242 determines whether there are any more forward mapping table entries 402 in the specified LBA range to be populated. If there are more forward mapping table entries 402 in the LBA range to populate, the routine 500 proceeds to step 540, where the preconditioning module 242 selects the next forward mapping table entry 402 in the LBA range. The routine 500 then returns to step 534, where the population process is repeated until all forward mapping table entries 402 in the specified LBA range have been populated. Once the preconditioning module 242 determines at step 538 that all of the forward mapping table entries 402 in the LBA range have been populated, the routine 500 ends.

According to further embodiments, instead of repeatedly writing the data pattern specified in the precondition command parameters to all of the pages of the GCUs identified for preconditioning, the preconditioning module 242 may store the data pattern in a metadata location on the storage media 210 and then mark each associated LBA, page, and/or block of the GCUs with an indicator of the data pattern, such as the pattern indicator 408 in the forward mapping table 244 described above in regard to FIG. 4. During the preconditioning, and potentially during the write performance testing that follows, if the controller 220 accesses an associated LBA of one of the GCUs for a read, the data from the data pattern stored in the metadata location may be substituted for the read. This substitution may further decrease the time for preconditioning of the drive, since the data pattern is only written once. In some embodiments, the preconditioning module 242 may expand the data pattern with valid ECC codes and other page-level or block-level metadata in order for the controller to make valid reads against the data pattern when redirected.

Based on the foregoing, it will be appreciated that technologies for providing extremely rapid SSD preconditioning are presented herein. While embodiments are generally described herein in regard to preconditioning the storage media of an SSD, it will be appreciated that the embodiments described in this disclosure may be utilized in any storage device implementing any solid-state storage technology where rapid preconditioning for write performance testing is desired. This may include solid-state drives, hybrid magnetic and solid-state drives, USB flash drives, memory cards and cartridges, storage controllers for arrays of flash memory devices, and the like. The above-described embodiments are merely possible examples of implementations, set forth for a clear understanding of the principles of the present disclosure.

The logical operations, functions, or steps described herein as part of a method, process or routine may be implemented (1) as a sequence of processor-implemented acts, software modules, or portions of code running on a controller or computing system and/or (2) as interconnected machine logic circuits or circuit modules within the controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

It will be appreciated that conditional language, including, but not limited to, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included within the scope of the present disclosure, and all possible claims to individual aspects or combinations of elements or steps are intended to be supported by the present disclosure.

What is claimed is:

1. A method of rapidly preconditioning a storage device comprising a solid-state storage media, the method comprising steps of:
    upon receiving a precondition command from a host operably connected to the storage device to precondition a range of logical block addresses (LBAs) of the storage media, determining, by a processor in communication with the storage media, a plurality of physical units of the storage media to be preconditioned based on the range of LBAs;
    determining, by the processor, a workload pattern from the precondition command;
    upon determining that the workload pattern indicates a random pattern, computing, by the processor, a valid page count for each of the plurality of physical units based on a random distribution; and
    populating forward mapping table entries of a forward mapping table associated with the storage media corresponding to the range of LBAs with random physical addresses from the plurality of physical units based at least on the computed valid page count for each of the plurality of physical units.

2. The method of claim 1, wherein the random distribution is described by a random leaky bucket algorithm based at least on an amount of overprovisioning of the storage device.

3. The method of claim 2, wherein determining the plurality of physical units to be preconditioned comprises:
    determining, by the processor, a number of physical units corresponding to a total logical capacity of the storage media based on a size of the physical units;
    determining, by the processor, an amount of logical capacity corresponding to the LBA range;
    determining, by the processor, a number of physical units needed for storing the logical capacity corresponding to the LBA range based on the number of physical units corresponding to the total logical capacity of the storage media and the amount of logical capacity corresponding to the LBA range; and
    determining, by the processor, a number of physical units needed for overprovisioning based on the number of physical units needed for storing the logical capacity and the amount of overprovisioning.

4. The method of claim 1, further comprising the step of:
    filling, by the processor, the plurality of physical units with data consistent with a data pattern specified with the precondition command.

5. The method of claim 1, wherein populating the forward mapping table entries of the forward mapping table further comprises marking the populated forward mapping table entries as valid.

6. The method of claim 1, further comprising the steps of:
    upon determining that the workload pattern indicates a sequential pattern, populating the forward mapping table entries of the forward mapping table corresponding to the range of LBAs with monotonically incrementing physical addresses from the plurality of physical units.

7. The method of claim 1, wherein the processor resides in a controller of the storage device.

8. The method of claim 1, wherein the storage media comprises NAND flash memory.

9. A storage device comprising:
    a storage media; and
    a controller coupled to the storage media and configured to:
        upon receiving a precondition command from a host operably connected to the storage device to precondition a range of logical block addresses (LBAs) of the storage media, determine a plurality of physical units of the storage media to be preconditioned based on the range of LBAs,
        fill the plurality of physical units with data consistent with a data pattern specified with the precondition command,
        determine a workload pattern from the precondition command, and
        populate forward mapping table entries of a forward mapping table associated with the storage media corresponding to the range of LBAs with physical addresses from the plurality of physical units based at least on the determined workload pattern.

10. The storage device of claim 9, wherein the controller is further configured to:
upon determining that the workload pattern indicates a random pattern, compute a valid page count for each of the plurality of physical units based on a random distribution; and
populate the forward mapping table entries of the forward mapping table with random physical addresses from the plurality of physical units based at least on the computed valid page count for each of the plurality of physical units.

11. The storage device of claim 10, wherein the random distribution is described by a random leaky bucket algorithm based at least on an amount of overprovisioning of the storage device.

12. The storage device of claim 11, wherein determining the plurality of physical units to be preconditioned comprises:
determining a number of physical units corresponding to a total logical capacity of the storage media based on a size of the physical units;
determining an amount of logical capacity corresponding to the LBA range;
determining a number of physical units needed for storing the logical capacity corresponding to the LBA range based on the number of physical units corresponding to the total logical capacity of the storage media and the amount of logical capacity corresponding to the LBA range; and
determining a number of physical units needed for overprovisioning based on the number of physical units needed for storing the logical capacity and the amount of overprovisioning.

13. The storage device of claim 9, wherein the controller is further configured to:
upon determining that the workload pattern indicates a sequential pattern, populate the forward mapping table entries of the forward mapping table corresponding to the range of LBAs with monotonically incrementing physical addresses from the plurality of physical units.

14. The storage device of claim 9, wherein populating the forward mapping table entries of the forward mapping table further comprises marking the populated forward mapping table entries as valid.

15. The storage device of claim 9, wherein filling the plurality of physical units with the data consistent with the data pattern bypasses normal programming processes of the controller.

16. A non-transitory computer readable medium comprising processor-executable instructions that, when executed by a CPU of a controller of a storage device comprising a solid-state storage media, cause the controller to rapidly precondition the storage device by:
determine a plurality of physical units of the storage media to be preconditioned based on a range of logical block addresses (LBAs) specified with a precondition command received from a host operably connected to the storage device;
determine a workload pattern from the precondition command;
upon determining that the workload pattern indicates a random pattern, compute a valid page count for each of the plurality of physical units based on a random distribution; and
populate forward mapping table entries of a forward mapping table associated with the storage media corresponding to the range of LBAs with random physical addresses from the plurality of physical units based at least on the computed valid page count for each of the plurality of physical units.

17. The non-transitory computer readable medium of claim 16, wherein the random distribution is described by a random leaky bucket algorithm based at least on an amount of overprovisioning of the storage device.

18. The non-transitory computer readable medium of claim 16, comprising further processor-executable instructions that cause the controller to fill the plurality of physical units with data consistent with a data pattern specified with the precondition command.

19. The non-transitory computer readable medium of claim 16, comprising further processor-executable instructions that cause the controller to set a field in each populated forward mapping table entry in the forward mapping table that indicates to the controller that reads to the corresponding physical address should return at least a portion of a data pattern specified with the precondition command.

20. The non-transitory computer readable medium of claim 16, comprising further processor-executable instructions that cause the controller to, upon determining that the workload pattern indicates a sequential pattern, populate the forward mapping table entries of the forward mapping table corresponding to the range of LBAs with monotonically incrementing physical addresses from the plurality of physical units.

* * * * *